United States Patent
Tsiang et al.

(10) Patent No.: US 10,515,796 B2
(45) Date of Patent: Dec. 24, 2019

(54) DRY ETCH RATE REDUCTION OF SILICON NITRIDE FILMS

(71) Applicant: Applied Materials, Inc., Santa Clara, CA (US)

(72) Inventors: Michael Wenyoung Tsiang, Fremont, CA (US); Hang Yu, Woodland, CA (US); Deenesh Padhi, Sunnyvale, CA (US); Tza-Jing Gung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/176,267

(22) Filed: Oct. 31, 2018

(65) Prior Publication Data
US 2019/0157077 A1   May 23, 2019

Related U.S. Application Data

(60) Provisional application No. 62/589,432, filed on Nov. 21, 2017.

(51) Int. Cl.
*H01L 21/02* (2006.01)
*H01L 21/033* (2006.01)
(Continued)

(52) U.S. Cl.
CPC ...... *H01L 21/02274* (2013.01); *C23C 16/345* (2013.01); *C23C 16/505* (2013.01);
(Continued)

(58) Field of Classification Search
None
See application file for complete search history.

(56) References Cited

U.S. PATENT DOCUMENTS

2003/0228770 A1   12/2003   Lee et al.
2008/0203528 A1    8/2008   Shih et al.
(Continued)

FOREIGN PATENT DOCUMENTS

KR   10-2017-0124108 A   11/2017
WO        2006/127463 A2   11/2006

OTHER PUBLICATIONS

PCT Notification of Transmittal of the International Search Report and the Written Opinion of the International Searching Authority for International Application No. PCT/US2018/058668; dated Feb. 22, 2019; 11 total pages.

*Primary Examiner* — Asok K Sarkar
(74) *Attorney, Agent, or Firm* — Patterson + Sheridan LLP

(57) ABSTRACT

Embodiments described herein relate to methods of forming silicon nitride films. In one embodiment, a first process gas set including a silicon-containing gas and a first nitrogen-containing gas is flowed into the process chamber. An initiation layer is deposited by applying a first radio frequency power to the first process gas set at a first frequency and a first power level. The first flow of the first nitrogen-containing gas of the first process gas set is discontinued and a second process gas set including the silicon-containing gas, a second nitrogen-containing gas, and a hydrogen-containing gas is flowed into the process chamber. A bulk silicon nitride layer is deposited on the initiation layer by applying a second RF power to the second process gas set at a second frequency higher than the first frequency and a second power level higher than the first power level.

20 Claims, 4 Drawing Sheets

(51) Int. Cl.
*C23C 16/505* (2006.01)
*C23C 16/34* (2006.01)

(52) U.S. Cl.
CPC ...... *H01L 21/0217* (2013.01); *H01L 21/0228* (2013.01); *H01L 21/0332* (2013.01)

(56) References Cited

U.S. PATENT DOCUMENTS

| | | |
|---|---|---|
| 2014/0038429 A1 | 2/2014 | Hirose et al. |
| 2015/0259791 A1* | 9/2015 | Hausmann .......... H01L 21/0217 118/697 |
| 2016/0203978 A1* | 7/2016 | Hashimoto ............. C23C 16/50 |

* cited by examiner

# DRY ETCH RATE REDUCTION OF SILICON NITRIDE FILMS

CROSS-REFERENCE TO RELATED APPLICATIONS

This application claims benefit of U.S. Provisional Patent Application Ser. No. 62/589,432, filed Nov. 21, 2017, which is herein incorporated by reference.

BACKGROUND

Field

Embodiments of the present disclosure generally relate to forming silicon nitride hard masks. More particularly, embodiments of the present disclosure relate to a method of forming a silicon nitride hard mask using plasma-enhanced chemical vapor deposition (PECVD) processes.

Description of the Related Art

Semiconductor device processing is used to create integrated circuits that are present in electrical devices. In the fabrication of integrated circuits, deposition processes are used to deposit layers of various materials upon semiconductor substrates. In order to form features on the substrates, etch processes are used to remove portions of substrates and/or dielectric layers deposited on substrates.

Hard masks are used for etching deep, high aspect ratio features with high resolutions that conventional photoresists cannot withstand. Prior to etching, hard masks are deposited over substrates and/or deposited dielectric layers. The hard masks are used as barrier layers when underlying layers to be etched have etch rates similar to photoresists used to pattern substrates or deposited dielectric layers. Hard masks have properties different from the underlying layers to be etched in order to protect portions of the underlying layers that are not to be removed. A pattern is defined in the silicon nitride hard mask using standard photolithographic techniques. Then, the hard mask is etched by plasma etching, gas etching, physical dry etching, or chemical dry etching to define a pattern in the silicon nitride by exposing regions which are to become the features. As the minimum feature sizes of integrated circuits continue to decrease, an improved process is needed to form films, for use as hard masks, that resist erosion and pattern changes to provide integrated circuits with features that have smooth surfaces and sidewalls. Thus, hard masks with high selectivity, low etch rates, and low bowing deltas are needed.

The selectivity, etch rates, and bowing deltas of a silicon nitride hard masks are optimized based on density and refractive index. Moreover, silicon nitride hard masks with a high compressive stress are dense and nitrogen-rich, and current plasma-enhanced chemical vapor deposition (PECVD) processes cannot form silicon nitride films to be used as hard masks that are dense and nitrogen-rich. As a result of high deposition rates, current PECVD processes form silicon nitride hard masks with significantly higher etch rates, lower selectivity, and higher bowing deltas than silicon nitride hard masks formed from atomic layer deposited films (ALD). However, silicon nitride films formed from ALD have a higher cost and have a lower throughput than films formed from PECVD. Therefore, an improved process is needed form films silicon nitride films a high density and refractive index.

SUMMARY

In one embodiment, a method for forming a silicon nitride film is provided. The method includes disposing a substrate including a surface in a chamber, flowing a silicon-containing gas and a first nitrogen-containing gas into the chamber at a first total flow rate, depositing a silicon and nitrogen containing layer on the surface of the substrate by applying a first radio frequency (RF) power at a first power level to the silicon-containing gas and the first nitrogen-containing gas, discontinuing the flow of the silicon-containing gas and the first nitrogen-containing gas and flowing a second nitrogen-containing gas into the chamber, and treating the silicon and nitrogen containing layer by applying a second RF power to the second nitrogen-containing gas at a second power level higher than the first power level. A flow rate of the second nitrogen-containing gas is higher than the first total flow rate. The flowing the silicon-containing gas and the first nitrogen-containing gas, the depositing the silicon and nitrogen containing layer, the discontinuing the flow of the silicon-containing gas and the first nitrogen-containing gas and the flowing the second nitrogen-containing gas, and the treating the silicon and nitrogen containing layer is repeated until a film with a predetermined thickness is formed.

In another embodiment, a method for forming a silicon nitride film is provided. The method includes disposing a substrate including a surface in a chamber, flowing a first process gas set including a silicon-containing gas and a first nitrogen-containing gas into the chamber, depositing an initiation layer on the surface of the substrate by applying a third radio frequency (RF) power to the first process gas set at a second frequency and a third power level, discontinuing the flowing the first nitrogen-containing gas of the first process gas set and flowing a second process gas set including the silicon-containing gas, a second nitrogen-containing gas, and a hydrogen-containing gas into the chamber, and depositing a bulk silicon nitride layer on the initiation layer by applying a first RF power to the second process gas set at a first frequency higher than the second frequency and a first power level higher than the third power level. The first process gas set is diatomic hydrogen gas-free and the second process gas set is diatomic nitrogen gas-free.

In yet another embodiment, a method for forming a silicon nitride film is provided. The method includes disposing a substrate including a surface in a chamber, flowing a first process gas set including a silicon-containing gas and a first nitrogen-containing gas into the chamber at a first total flow rate, depositing a silicon and nitride containing layer on the surface of the substrate by applying a first radio frequency (RF) power to the first process gas set at a first frequency of 10 megahertz (MHz) and 20 MHz and a first power level of about 50 Watts (W) to about 100 W for a duration of about 1 second to about 5 seconds at a first pressure of the chamber less than 8 torr, discontinuing the flow of first process gas set, flowing a second process gas set including a second nitrogen-containing gas into the chamber at a second total flow rate, treating the silicon and nitrogen containing layer by applying a second RF power at the first frequency and a second power level of about 80 W to about 120 W to the second process gas set for a duration of about 5 second to 15 seconds at a second pressure of the chamber. The second total flow rate is higher than the first total flow rate, the second power level is higher than the first power level, and the first pressure of the chamber is higher than the second pressure of the chamber. The flowing the first process gas set, the depositing the silicon and nitride containing layer, the discontinuing the flow of the first process gas set, the flowing the second process gas set, and the treating of the silicon and nitrogen containing layer is repeated until a first initiation layer with a predetermined thickness is formed. The flow of the second process gas set is discontinued and a third process gas set including the silicon-containing gas, a third nitrogen-containing gas, and a hydrogen-containing gas is flowed into the chamber. The third process gas set is diatomic nitrogen gas-free. A bulk silicon nitride layer is deposited on the first initiation layer by applying the first RF power to the third process gas set at the first frequency and the first power level for a duration of about 200 to about 300 seconds at a third pressure of the chamber. The second pressure of the chamber is higher than the third pressure of the chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure provides methods for forming silicon nitride films using PECVD processes. The films may be deposited such that they have a high compressive stress. Varying the flow of process gasses and RF powers over time, as described herein, provides silicon nitride films with high selectivity, low etch rates, and low bowing deltas needed.

Figure 1:
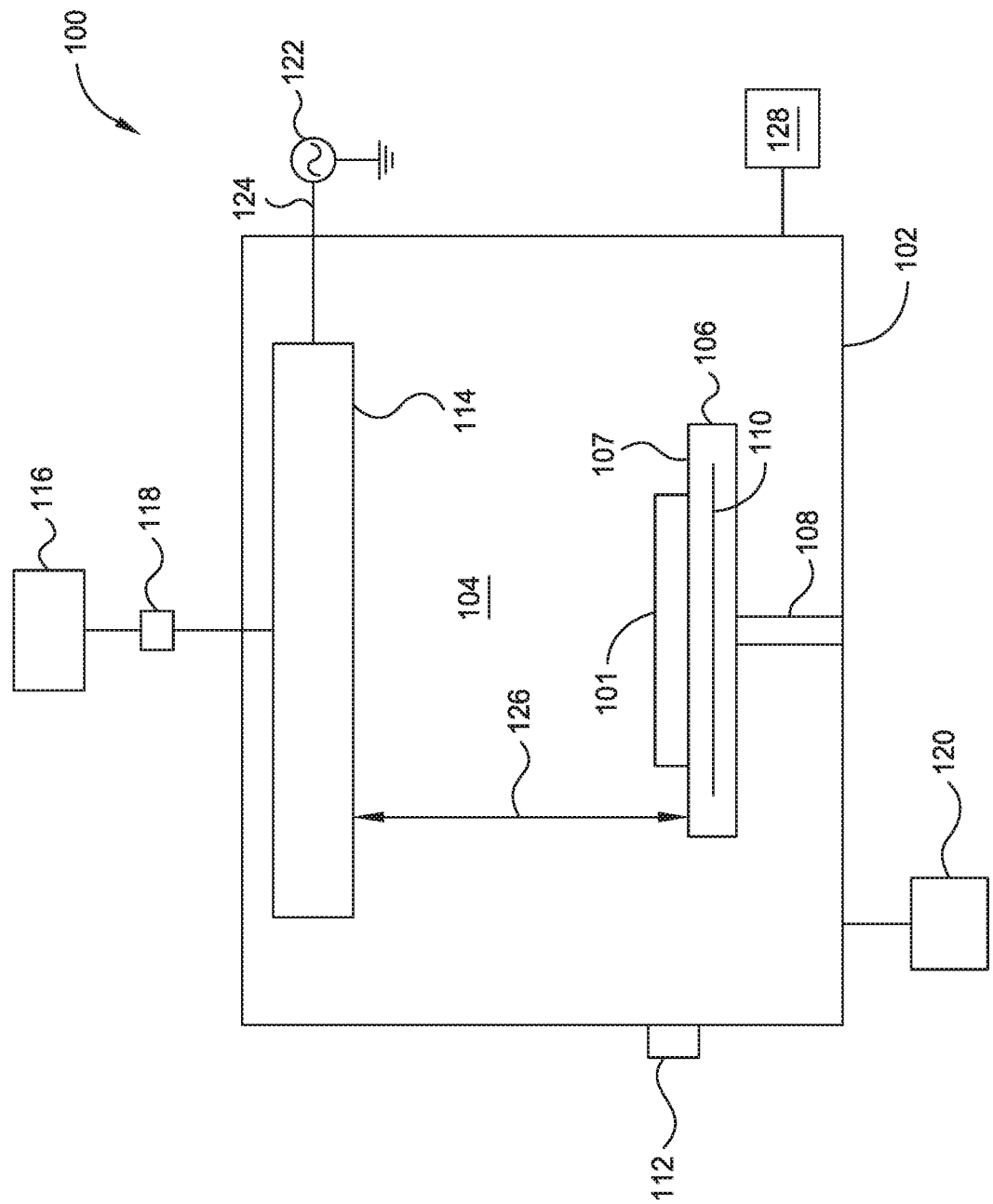
FIG. 1 is a schematic cross-sectional view of a plasma-enhanced chemical vapor deposition chamber according to an embodiment of the disclosure.

FIG. 1 is a schematic cross-sectional view of a PECVD chamber 100 utilized for methods for forming silicon nitride films. One example of the chamber 100 is a PRODUCER® chamber manufactured by Applied Materials, Inc., located in Santa Clara, Calif. It is to be understood that the PECVD chamber described below is an exemplary PECVD chamber and other PECVD chambers, including PECVD chambers from other manufacturers, may be used with or modified to accomplish aspects of the present disclosure.

The chamber 100 has a chamber body 102 that includes a processing volume 104 that includes a substrate support 106 disposed therein to support a substrate 101. The substrate support 106 includes a heating element 110 and a mechanism (not shown) that retains the substrate 101 on a support surface 107 of the substrate support 106, such as an electrostatic chuck, a vacuum chuck, a substrate retaining clamp, or the like. The substrate support 106 is coupled to and movably disposed in the processing volume 104 by a stem 108 connected to a lift system (not shown) that moves the substrate support 106 between an elevated processing position and a lowered position that facilitates transfer of the substrate 101 to and from the chamber 100 through an opening 112.

The chamber 100 includes a flow controller 118, such as a mass flow control (MFC) device, disposed between the a gas source 116 and the chamber body 102 to control a flow rate of process gasses from the gas source 116 to a showerhead 114 used for distributing the process gasses across the processing volume 104. The showerhead 114 is connected to a RF power source 122 by a RF feed 124 for generating a plasma in the processing volume 104 from the process gasses. The RF power source 122 provides RF energy to the showerhead 114 to facilitate generation of a plasma between the showerhead 114 and the substrate support 106. The stem 108 is configured to move the substrate support 106 to an elevated processing position at a process distance 126 between the support surface 107 and the showerhead 114. A vacuum pump 120 is coupled to the chamber body 102 for controlling the pressure within the processing volume 104. A controller 128 is coupled to the chamber 100 and configured to control aspects of the chamber 100 during processing.

Figure 2:
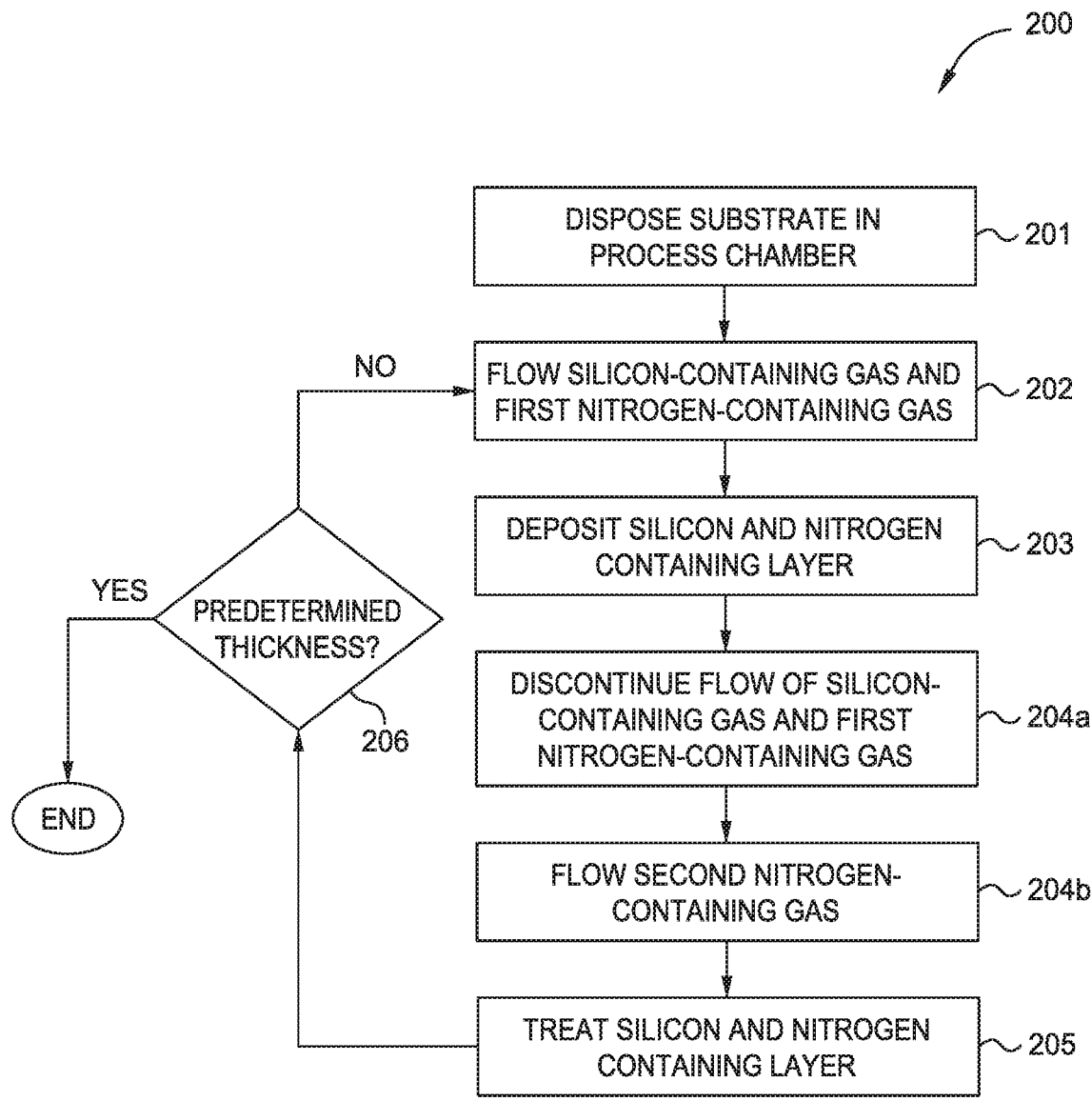
FIG. 2 is a flow diagram of forming a silicon nitride film by cyclic deposition-treatment according to an embodiment of the disclosure.

FIG. 2 is a flow diagram of a method 200 for forming a film tailored to the properties of an underlying layer, the use of the film as a hard mask, and the etch chemistries to be used on the film. To facilitate explanation, FIG. 2 will be described with reference to FIG. 1. However, it is to be noted that a chamber other than chamber 100 of FIG. 1 may be utilized in conjunction with method 200.

At operation 201, a substrate 101 including a surface is disposed in a chamber 100. In one embodiment, the substrate 101 is disposed on the support surface 107 of the substrate support 106, the support surface 107 at a process distance 126 from the showerhead 114. The process distance 126 is about 250 millimeters (mm) to about 350 mm. The process distance 126 increases ion bombardment to densify the film. In one embodiment, the substrate support is heated to about 300 degrees Celsius (° C.) to about 500° C.

At operation 202, a silicon-containing gas and a first nitrogen-containing gas are flowed into the chamber 100 at a first total flow rate. In one embodiment, the flow controller 118 controls the first flow rate of the silicon-containing gas and the first nitrogen-containing gas from the gas source 116 and the showerhead 114 distributes the silicon-containing gas and the first nitrogen-containing gas across the processing volume 104. The silicon-containing gas can include silane ($SH_4$), and/or dimers and oligomers of silane, and the flow rate of the silicon-containing gas may be about 10 standard cubic centimeters per minute (sccm) to about 50 sccm. The first nitrogen-containing gas includes ammonia ($NH_3$) and/or diatomic nitrogen gas ($N_2$). In some embodiments, the ammonia of the first nitrogen-containing gas is flowed at a flow rate of about 30 sccm to about 1500 sccm and the diatomic nitrogen gas of the first nitrogen-containing gas is flowed at a flow rate of about 500 sccm to about 3000 sccm. In the chamber 100, a space velocity (space velocity= (sccm of gas flow)/(cc of process volume)) of the silicon-containing gas is about 0.003 $min^{-1}$ to about 0.4 $min^{-1}$, a space velocity of the $NH_3$ of the first nitrogen-containing gas is about 0.25 $min^{-1}$ to about 10 $min^{-1}$, and/or a space velocity of the $N_2$ of the first nitrogen-containing gas is about 0.35 $min^{-1}$ to about 19 $min^{-1}$. In one embodiment, at operation 202, argon (Ar) is flowed at a first argon flow rate of 2000 sccm to about 4000 sccm and diatomic hydrogen gas ($H_2$) is flowed at a first hydrogen gas flow rate of about 500 sccm to about 1500 sccm to the chamber 100.

At operation 203, a silicon and nitrogen containing layer of about 5 Å to 50 Å is deposited. During the deposition, a first radio frequency (RF) power at a first frequency and a first power level is applied to the silicon-containing gas and the first nitrogen-containing gas to ionize the silicon-containing gas and the first nitrogen-containing gas. In one embodiment, the RF power source 122 provides RF energy to the showerhead 114 to facilitate generation of plasma between the showerhead 114 and the substrate support 106. The first RF power may be applied for about 1 second to about 8 seconds at first pressure of the chamber, which is less than about 6 torr. The first frequency may be 10 MHz to about 20 MHz. The first power level is in a range of about 50 W to about 100 W. The first RF power is applied at a power density (power density=power(W)/surface area of the substrate($cm^2$)) of about 0.05 $W/cm^2$ to about 0.35 $W/cm^2$.

At operation 204a, after the silicon and nitrogen containing layer is deposited in operation 203, the flow of the silicon-containing gas and the first-nitrogen containing gas is discontinued. At operation 204b a second nitrogen-containing gas is flowed into the chamber 100 at a second flow rate higher than the first total flow rate. The second nitrogen-containing gas is diatomic nitrogen gas ($N_2$), and in some embodiments is flowed into the chamber 100 at. the second flow rate of about 10000 sccm to about 20000 sccm. A space velocity of the $N_2$ of the second nitrogen-containing gas is about 4.0 $min^{-1}$ to about 130.0 $min^{-1}$. In one embodiment, at operation 204b, argon (Ar) is flowed in to the chamber 100 at a second argon flow rate of about 7000 sccm to about 8000 sccm.

At operation 205, the silicon and nitrogen containing layer is treated. A second RF power is applied to the second-nitrogen containing gas at the first frequency of 10 MHz to about 20 MHz and at a second power level. The second RF power may be applied for about 5 seconds to about 20 seconds at a second pressure of the chamber 100 higher than the first pressure of the chamber 100. In one example, the second pressure is less than 6 torr. The second power level may be in a range of about 80 W to about 120 W. The second RF power is applied at a power density of about 0.08 $W/cm^2$ to about 0.3 $W/cm^2$. The second power level is higher than the first power level.

At operation 206, a determination is made as to whether the cyclic deposition-treatment process is repeated. Such a made determination may be based, for example, on whether a film with a predetermined thickness is formed, such as about 100 Å to about 800 Å. In one embodiment, the silicon and nitrogen containing layer formed by the method 200 has a stress of about −1.00 gigapascal (GPa) to about −2.00 GPa, a density of 2.50 $g/cm^3$ to about 3.50 $g/cm^3$, a refractive index of 1.50 to 2.50, and a wet etch rate of about 6.00 angstrom per minute (Å/min) to about 7.00 Å/min. The stress, the density, the refractive index, and the wet etch rate of the silicon and nitrogen containing layer formed by the method 200 are substantially equivalent to a stress, a density, a refractive index, and a wet etch rate of a silicon and nitrogen containing layer formed by atomic layer deposition (ALD). However, in some embodiments, at least 15 substrates per hour may be processed via the method 200. In one embodiment, 25 substrates per hour may be processed via the method 200. In contrast, substrate throughput using ALD is generally lower.

Additionally, the method 200 may further include a first oxygen-doping process or a second oxygen-doping process to optimize the etch rate of the silicon nitride film while not converting the film to a silicon oxynitride film. In one example of a first oxygen-doping process, at operation 204b an oxygen-containing gas is flowed into the chamber 100, and the second RF power is applied to the oxygen-containing gas during treatment at operation 205. In a second oxygen doping process, the oxygen-containing gas is flowed after the treatment of operation 205 and the second RF power is applied for about 2 seconds to about 10 seconds at the second pressure. The oxygen-containing gas can include nitrous oxide ($N_2O$) and/or oxygen gas ($O_2$). A flow rate of $N_2O$ may be about 50 sccm to about 800 sccm and a flow rate of the $O_2$ may be about 10 sccm to about 1,000 sccm. A space velocity of the oxygen-containing gas is about 0.003 $min^{-1}$ to about 12.0 $min^{-1}$. The second RF power is applied at the first frequency of 10 MHz to about 20 MHz and at the second power level. Furthermore, the layers may be UV cured after treatment to further densify the film.

Figure 3:
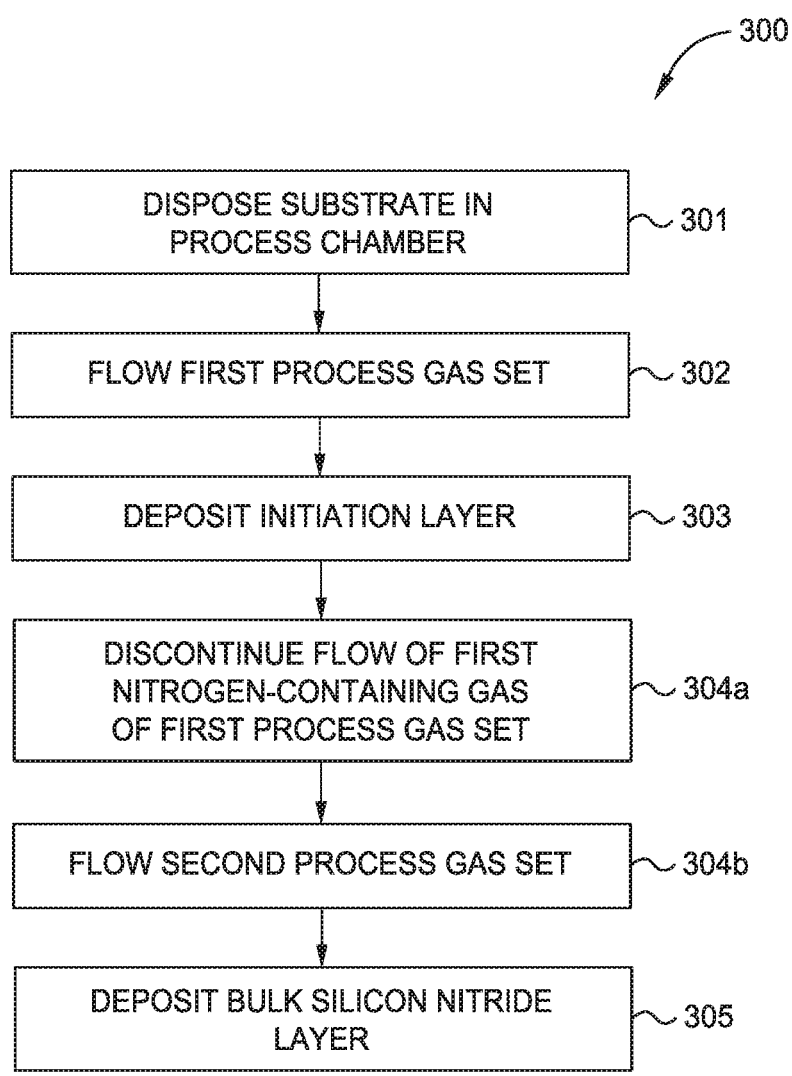
FIG. 3 is a flow diagram of forming a silicon nitride film by bulk deposition according to an embodiment of the disclosure.

FIG. 3 is a flow diagram of a method 300 for forming a film tailored to the properties of an underlying layer, the use of the film as a hard mask, and the etch chemistries to be used on the film. To facilitate explanation, FIG. 3 will be described with reference to FIG. 1. However, it is to be noted that a chamber other than chamber 100 of FIG. 1 may be utilized in conjunction with method 300.

At operation 301, a substrate 101 having a surface is disposed in a chamber 100. In one embodiment, the substrate 101 is disposed on the support surface 107 of the substrate support 106, the support surface 107 at a process distance 126 from the showerhead 114. The process distance 126 is about 250 millimeters (mm) to about 350 mm. The process distance 126 increases ion bombardment to densify the film. In one embodiment, the substrate support is heated to about 300 degrees Celsius (° C.) to about 500° C. The substrate may optionally be ammonia ($NH_3$) soaked after operation 201 by flowing about 200 sccm to about 600 sccm of $NH_3$ for about 10 seconds to about 30 seconds.

At operation 302, a first process gas set comprising a silicon-containing gas and a first nitrogen-containing gas is flowed into the chamber 100. The first process gas set is diatomic hydrogen gas-free and may also include an inert gas. The silicon-containing gas can include silane ($SiH_4$), and/or dimers and oligomers of silane. In one embodiment, the flow controller 118 controls the flow rate of the first process gas set from the gas source 116, and the showerhead 114 distributes the first process gas set across the processing volume 104. The silicon-containing gas is flowed into the chamber 100 at a flow rate of about 10 to about 50 sccm. The first nitrogen-containing gas includes ammonia ($NH_3$) and diatomic nitrogen gas ($N_2$). The $NH_3$ of the first nitrogen-containing gas is flowed at a flow rate of about 100 sccm to about 200 sccm and the diatomic nitrogen gas of the first nitrogen-containing gas is flowed at a flow rate of about 1000 sccm to about 3000 sccm. The inert gas can include argon (Ar) with a flow rate of 2000 sccm to about 4000 sccm. In the chamber 100, a space velocity of the silicon-containing gas is about 0.003 $min^{-1}$ to about 0.4 $min^{-1}$, a space velocity of the $NH_3$ of the first nitrogen-containing gas is about 0.03 $min^{-1}$ to about 1.3 $min^{-1}$, a space velocity of the $N_2$ of the first nitrogen-containing gas is about 0.3 $min^{-1}$ to about 19 min-1, and a space velocity of the inert gas is about 0.5 $min^{-1}$ to about 25 $min^{-1}$.

At operation 303, an initiation layer of about 5 Å to about 50 Å is deposited. The initiation layer provides for a film with an ideal surface roughness, adhesion of the bulk deposited layer, and plasma stability, as low process gas flow can result in plasma instability. A third RF power is applied to the first process gas set at a second frequency and the third power level. The third RF power is applied for duration of about 10 seconds to about 20 seconds at a first pressure of the chamber about 2 torr to about 8 torr. In one embodiment, the RF power source 122 provides RF energy to the showerhead 114 to facilitate generation of plasma between the showerhead 114 and the substrate support 106. The second frequency and third power level are less than about 500 kHz and about 50 W to about 100 W, respectively. The third RF power is applied at a power density of about 0.05 W/cm$^2$ to about 0.25 W/cm$^2$.

At operation 304a, after the initiation layer is deposited, the flow of the first nitrogen-containing gas is discontinued. Operation 304b includes flowing a second process gas set comprising the silicon-containing gas, a second nitrogen-containing gas, and a hydrogen-containing gas into the chamber 100. The second process gas set is diatomic nitrogen gas-free and may also include an inert gas. In one example, the silicon-containing gas includes silane (SiH$_4$) with a flow rate of about 10 sccm to about 50 sccm, the second nitrogen-containing gas includes ammonia (NH$_3$), and the hydrogen-containing gas includes diatomic hydrogen (H$_2$) with a flow rate of 3000 sccm to about 4000 sccm. H$_2$ breaks Si—H bonds to remove in-film hydrogen and create dangling bonds while nitrogen-containing gas reacts with the active surface (e.g., the dangling bonds) of the substrate to create Si—Si bonds and Si—N bonds to form a nitrogen-rich film. The inert gas can include Ar with a flow rate of about 2000 sccm to about 4000 sccm. In the chamber 100 the space velocity of the silicon-containing gas is about 0.003 min$^{-1}$ to about 0.4 min$^{-1}$, a space velocity of the second nitrogen-containing gas is about 0.4 min$^{-1}$ to about 13 min$^{-1}$, a space velocity of the hydrogen-containing gas is about 1.0 min$^{-1}$ to about 26 min$^{-1}$, and the space velocity of the inert gas is about 0.7 min$^{-1}$ to about 26 min$^{-1}$.

At operation 305, a bulk silicon nitride layer of about 100 Å to about 700 Å is deposited. The first RF power is applied to the second process gas set at the first frequency and the first power level. The first frequency is higher than the second frequency and the first power level higher than the third power level. The first RF power may be applied for about 200 seconds to about 300 seconds at a second pressure of the chamber 100 substantially the same as the pressure in the chamber 100 during the depositing of the initiation layer. The first frequency is 10 MHz to about 20 MHz and the first power level is about 50 W to about 100 W. The first RF power is applied at a power density of about 0.05 W/cm$^2$ to about 0.25 W/cm$^2$. It is believed that increasing the power and frequency applied to the process gas as compared to operation 303 can increase ion bombardment and densify the film.

The disclosed silicon nitride film by bulk deposition process forms the silicon and nitrogen containing film including the initiation layer and the bulk silicon nitride layer. The silicon and nitrogen containing film is formed with a predetermined thickness, such as about 100 Å to about 800 Å. In one embodiment, the silicon and nitrogen containing film formed by the method 300 has a stress of about −1.00 gigapascal (GPa) to about −2.00 GPa, a density of about 2.50 g/cm$^3$ to about 3.50 g/cm$^3$, a refractive index of about 1.50 to about 2.50, and a wet etch rate of about 6.00 angstrom per minute (Å/min) to about 7.00 Å/min. The stress, the density, the refractive index, and the wet etch rate of the silicon and nitrogen containing film formed by the method 300 are substantially equivalent to a stress, a density, a refractive index, and a wet etch rate of a silicon and nitrogen containing layer formed by atomic layer deposition (ALD). However, in some embodiments, at least 15 substrates per hour may be processed via the method 300.

The method 300 can include two transition processes, transitioning from the depositing the initiation layer at operation 303, and transitioning to the depositing the bulk silicon nitride layer, in order to transition from the first process gas set to the second process gas set and from the third RF power to the first RF power. Transitioning from the depositing the initiation layer includes applying a fourth RF power at the first frequency and a fourth power level, and the third RF power at the second frequency and third power level to the first process gas set for a duration of about 1 second to about 3 seconds. The fourth power level is about 25 W to about 75 W. The third power level is higher than the fourth power level. The fourth RF power is applied at a power density of about 0.02 W/cm$^2$ to about 0.2 W/cm$^2$.

Transitioning to depositing the bulk silicon nitride layer includes applying the first RF power at the first frequency and the first power level, and a fifth RF power at the second frequency and a fifth power level of about 15 W to about 45 W to the first process gas set for a duration of about 1 second to about 3 seconds. The flow rate of the first nitrogen-containing gas during the transitioning from the depositing the initiation layer is higher than a flow rate of the first nitrogen-containing gas at the transitioning to the depositing of the bulk silicon nitride layer. The fifth RF power is applied at a power density of about 0.015 W/cm$^2$ to about 0.12 W/cm$^2$.

Additionally, the method 300 may further include oxygen-doping the initiation layer by flowing an oxygen-containing gas into the chamber 100 at operation 302 and applying the third RF power to the oxygen-containing gas at operation 303. The oxygen-containing gas can include nitrous oxide (N$_2$O) and/or oxygen gas (O$_2$). At operation 302, a flow rate of N$_2$O may be about 40 sccm to about 1,000 sccm and a flow rate of the O$_2$ may be about 10 sccm to about 1,000 sccm. At operation 302, a space velocity of the oxygen-containing gas is about 0.003 min$^{-1}$ to about 12 min$^{-1}$. The bulk silicon nitride layer may also be oxygen-doped by flowing the oxygen-containing gas into the chamber 100 at operation 304b and applying the first RF power to the oxygen-containing gas at operation 205. At operation 304b, the flow rate of N$_2$O may be about 40 sccm to about 1,000 sccm and the flow rate of the O$_2$ may be about 10 sccm to about 1,000 sccm. At operation 304b, the space velocity of the oxygen-containing gas is about 0.003 min$^{-1}$ to about 12 min$^{-1}$. Additionally, the film may be UV cured at various thicknesses during operation 305 to further densify the film.

Figure 4:
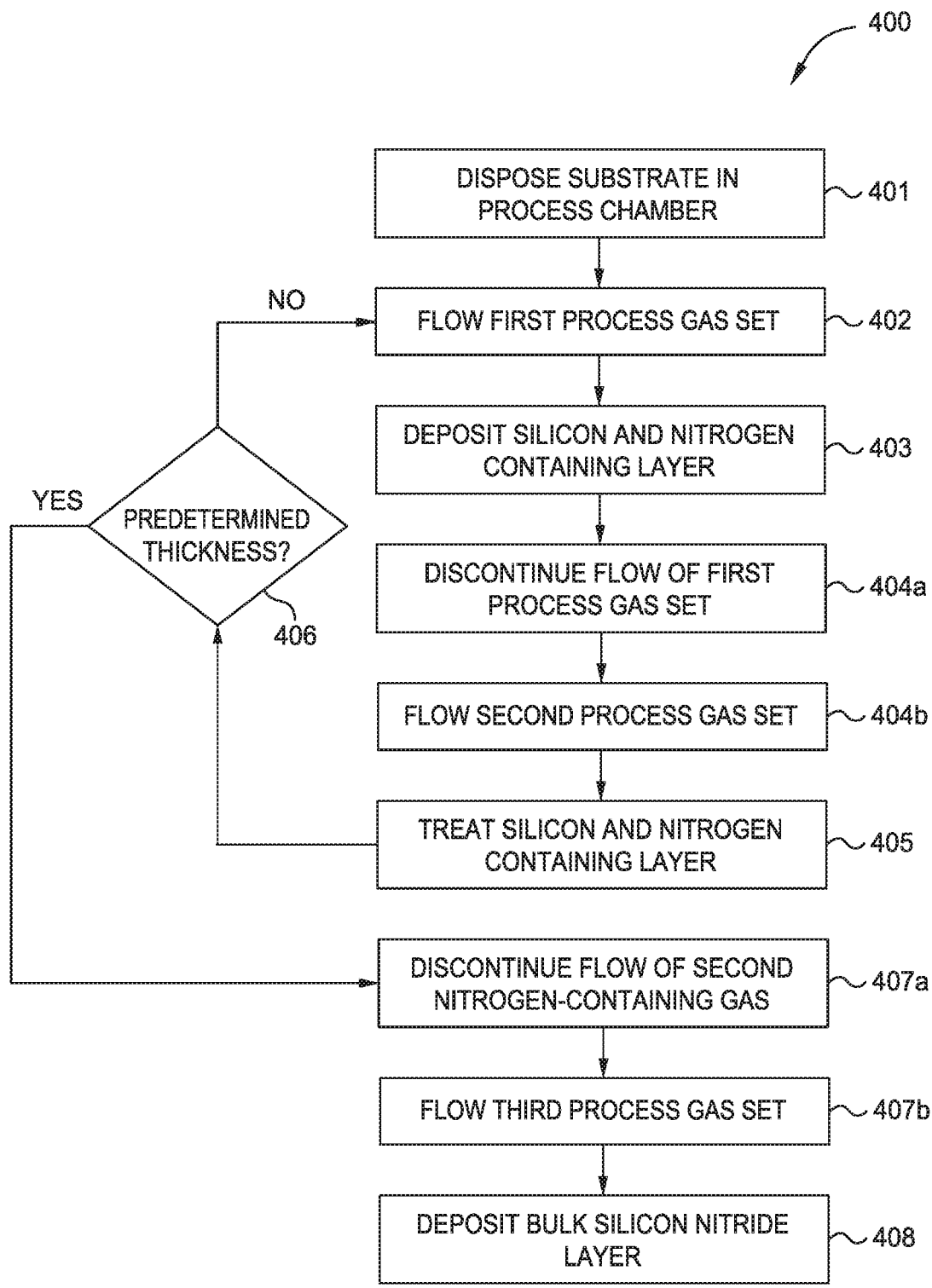
FIG. 4 is a flow diagram of forming a silicon nitride film by combining cyclic deposition-treatment and bulk deposition according to an embodiment of the disclosure.

FIG. 4 is a flow diagram of a method 400 for forming a film tailored to the properties of an underlying layer, the use of the film as a hard mask, and the etch chemistries to be used on the film. To facilitate explanation, FIG. 4 will be described with reference to FIG. 1. However, it is to be noted that a chamber other than chamber 100 of FIG. 1 may be utilized in conjunction with method 400.

At operation 401, a substrate 101 having a surface is disposed in a chamber 100. In one embodiment, the substrate 101 is disposed on the support surface 107 of the substrate support 106, the support surface 107 at a process distance 126 from the showerhead 114. The process distance 126 is about 250 millimeters (mm) to about 350 mm. The process distance 126 increases ion bombardment to densify the film. In one embodiment, the substrate support is heated to about 300 degrees Celsius (° C.) to about 500° C. The substrate may optionally be $NH_3$ soaked after operation 401 by flowing about 200 sccm to about 600 sccm of ammonia ($NH_3$) for about 10 seconds to about 30 seconds.

At operation 402, a first process gas set comprising a silicon-containing and a first nitrogen-containing gas is flowed into the chamber 100 at a first total flow rate. In one embodiment, the flow controller 118 controls the flow rate of the first process gas set from the gas source 116 and the showerhead 114 distributes the first process gas set across the processing volume 104. The silicon-containing gas can include silane ($SH_4$) and/or dimers and oligomers of silane with a flow rate of about 10 sccm to about 50 sccm. The first nitrogen-containing gas includes ammonia ($NH_3$) and diatomic nitrogen gas ($N_2$). The ammonia of the first gas set is flowed at a flow rate of about 750 sccm to about 1500 sccm and the nitrogen-containing gas of the first gas set is flowed at a flow rate of about 1000 sccm to about 3000 sccm. In the chamber 100 a space velocity of the silicon-containing gas is about 0.003 $min^{-1}$ to about 0.4 $min^{-1}$, a space velocity of the $NH_3$ of the first nitrogen-containing gas is about 0.25 $min^{-1}$ to about 10 $min^{-1}$, and a space velocity of the $N_2$ of the first nitrogen-containing gas is about 0.35 $min^{-1}$ to about 20 $min^{-1}$.

At operation 403, a silicon and nitrogen containing layer of about 5 Å to 50 Å is deposited. During the deposition, the first RF power is applied to the first process gas set at the first frequency and the first power level. In one embodiment, the RF power source 122 provides RF energy to the showerhead 114 to facilitate generation of plasma between the showerhead 114 and the substrate support 106. The first RF power may be applied for about 1 second to about 5 seconds at a first pressure of the chamber, which is less than 8 torr. The first frequency is about 10 MHz to about 20 MHz and the first power level is about 50 W to about 100 W. The first power is applied at a power density of about 0.05 to about 0.25.

At operation 404a, after the silicon and nitrogen containing layer is deposited, the flow of the first process gas set is discontinued. At operation 404b a second process gas set comprising a second nitrogen-containing gas is flowed into the chamber 100 at a second total flow rate higher than the first total flow rate. The first nitrogen-containing gas is diatomic nitrogen gas ($N_2$) with a flow rate of about 10000 sccm to about 20000 sccm. A space velocity of the $N_2$ of the second nitrogen-containing gas is about 3.5 $min^{-1}$ to about 128 $min^{-1}$.

At operation 405, the silicon and nitrogen containing layer is treated. The second RF power is applied to the second-nitrogen containing gas at the first frequency of about 10 MHz to about 20 MHz and the second power level. The second RF power may be applied for about 5 seconds to about 20 seconds at a second pressure of the chamber higher than the first pressure of the chamber during the deposition of the silicon and nitride layer. The second pressure is less than 8 torr and the second power level is about 80 W to about 120 W. The second power level is higher than the first power level.

At operation 406, a determination is made as to whether the cyclic deposition-treatment process is repeated. Such a made determination may be based, for example, on whether a first initiation layer with a predetermined thickness is formed, such as about 5 Å to about 50 Å. Additionally, the method 400 may further include a first oxygen-doping process or a second oxygen-doping process to optimize the etch rate of the silicon nitride film while not converting film to a silicon oxynitride film. In a first oxygen-doping process, at operation 404b an oxygen-containing gas is flowed into the chamber 100 and the second RF power is applied to the oxygen-containing gas during treatment at operation 405. In a second oxygen doping process, the oxygen-containing gas is flowed after treatment of operation 405 and the second RF power is applied after treatment for about 2 seconds to about 10 seconds. The oxygen-containing gas can include nitrous oxide ($N_2O$) and/or oxygen gas ($O_2$). A flow rate of $N_2O$ may be about 50 sccm to about 800 sccm and a flow rate of the $O_2$ gas may be about 10 sccm to about 1,000 sccm. A space velocity of the oxygen-containing gas is about 0.003 $min^{-1}$ to about 12 $min^{-1}$. The second RF power is applied at the first frequency and the second power level. Furthermore, the layers may be UV cured after treatment to further densify the film.

After the first initiation layer is formed in operation 406, at operation 407a the second process gas set is discontinued and at operation 407b a third process gas set comprising the silicon-containing gas, a third nitrogen-containing gas, and a hydrogen-containing gas is flowed into the chamber 100. In one embodiment, operation 407a and operation 407b occur simultaneously. The third process gas set is diatomic nitrogen gas-free and may also include an inert gas. In one example, the silicon-containing gas includes silane ($SiH_4$) with a flow rate of about 10 sccm to about 50 sccm, the third nitrogen-containing gas includes ammonia ($NH_3$), and the hydrogen-containing gas includes $H_2$ with a flow rate of 3000 sccm to about 4000 sccm. The inert gas can include Ar with a flow rate of 2000 sccm to about 4000 sccm. In the chamber 100, the space velocity of the silicon-containing gas is about 0.003 $min^{-1}$ to about 0.4 $min^{-1}$, a space velocity of the third nitrogen-containing gas is about 0.25 $min^{-1}$ to about 10 $min^{-1}$, a space velocity of the hydrogen-containing gas is about 1 $min^{-1}$ to about 26 $min^{-1}$, and a space velocity of the inert gas is about 0.7 $min^{-1}$ to about 26 $min^{-1}$.

At operation 408, a bulk silicon nitride layer of about 100 Å to about 700 Å is deposited. The first RF power is applied to the third process gas set at the first frequency and the first power level. The first RF power may be applied for about 200 seconds to about 300 seconds at a third pressure of the chamber lower than the second pressure of the chamber during treatment of the silicon and nitrogen containing layer. The first frequency is about 10 MHz to about 20 MHz and the first power level may be about 50 W to about 100 W. The first power is applied at a power density of about 0.05 to about 0.25.

The disclosed silicon nitride film deposition process forms the silicon and nitrogen containing film comprising at least a first initiation layer and the bulk silicon nitride layer. The silicon and nitrogen containing film is formed with a predetermined thickness, such as about 100 Å to about 800 Å. In one embodiment, the silicon and nitrogen containing film formed by the method 400 has a stress of about −1.00 gigapascal (GPa) to about −2.00 GPa, a density of about 2.50 $g/cm^3$ to about 3.50 $g/cm^3$, a refractive index of about 1.50 to about 2.50, and a wet etch rate of about 6.00 angstrom per minute (Å/min) to about 7.00 Å/min. The stress, the density, the refractive index, and the wet etch rate of the silicon and nitrogen containing film formed by the method 300 are substantially equivalent to a stress, a density, a refractive index, and a wet etch rate of a silicon and nitrogen containing layer formed by ALD. However, in some embodiments, at least 15 substrates per hour may be processed via the method 300.

The method 400 may further include depositing a second initiation layer before depositing the bulk silicon nitride layer. In operation 407a, after the flow of the second process gas set is discontinued and before the third process gas set is flowed, a fourth process gas set comprising the silicon-containing gas and the first nitrogen-containing gas is flowed into the process chamber. The first process gas set is diatomic hydrogen gas-free and may also include the inert gas. The silicon-containing gas includes silane ($SH_4$) and/or dimers and oligomers of silane, and the flow rate of the silicon-containing gas may be about 10 to about 50 sccm. The first nitrogen-containing gas includes ammonia ($NH_3$) and diatomic nitrogen gas ($N_2$). In some embodiments, the ammonia of the first nitrogen-containing gas is flowed the a flow rate of about 100 sccm to about 200 sccm and the diatomic nitrogen gas of the first nitrogen-containing gas is flowed at the flow rate of about 1000 sccm to about 3000 sccm. The inert gas can include Ar with the flow rate of 2000 sccm to about 4000 sccm. In the chamber 100, the space velocity of the silicon-containing gas is about 0.003 $min^{-1}$ to about 0.4 $min^{-1}$, the space velocity of the $NH_3$ of the first nitrogen-containing gas is about 0.03 $min^{-1}$ to about 3 $min^{-1}$, the space velocity of the $N_2$ of the first nitrogen-containing gas is about 0.35 $min^{-1}$ to about 19 min-1, and the space velocity of the inert gas is about 0.7 $min^{-1}$ to about 26 $min^{-1}$.

The second initiation layer is deposited by applying the third RF power to the fourth process gas set at the second frequency less than 500 kHz and a third power level of about 50 W to about 100 W to deposit a second initiation layer of about 5 Å to 50 Å. The third RF power is applied for a duration of about 10 seconds to about 20 seconds at the third pressure of the chamber. The third RF power is applied at a power density of about 0.05 $W/cm^2$ to about 0.25 $W/cm^2$.

After the deposition of the second initiation layer, the method 400 may include two transition processes, transitioning from the depositing the first initiation layer and transitioning to the depositing the bulk silicon nitride layer, in order to transition from the fourth process gas set to third process gas set and from the third RF power to the first RF power. Transitioning from the depositing the initiation layer includes applying the fourth RF power at the first frequency and the fourth power level of about 25 W to about 75 W, and the third RF power at the second frequency and third power level to the fourth process gas set for a duration of about 1 second to about 3 seconds. The third power level is higher than the fourth power level.

Transitioning to the depositing the bulk silicon nitride layer includes applying the first RF power at the first frequency and the first power level, and the fifth RF power at the second frequency and the fifth power level of about 15 W to about 45 W to the first process gas set for a duration of about 1 second to about 3 seconds. The flow rate of the first nitrogen-containing gas during the transitioning from the depositing the initiation layer is higher than a flow rate of the first nitrogen-containing gas at the transitioning to the depositing of the bulk silicon nitride layer. After the transitioning to the depositing the flow of the fourth process gas set is discontinued.

Additionally, method 400 may further include oxygen-doping the second initiation layer by flowing an oxygen-containing gas into the process chamber at operation 407a, after the flow of the second process gas set is discontinued and before the third process gas set is flowed. During the oxygen doping, the third RF power is applied to an oxygen-containing gas while the second initiation layer is deposited. The oxygen-containing gas can include nitrous oxide ($N_2O$) and/or oxygen gas ($O_2$). To oxygen-dope the second initiation layer, a flow rate of $N_2O$ may be about 40 sccm to about 1,000 sccm and a flow rate of the $O_2$ may be about 10 sccm to about 1,000 sccm. A space velocity of the oxygen-containing gas is about 0.003 $min^{-1}$ to about 13 $min^{-1}$ to oxygen-dope the second initiation layer. The bulk silicon nitride layer may also be oxygen-doped by flowing the oxygen-containing gas into the process chamber at operation 408 and applying the second RF power to the oxygen-containing gas at operation 408. At process 408, the flow rate of $N_2O$ may be about 40 sccm to about 1,000 sccm and the flow rate of the $O_2$ may be about 10 sccm to about 1,000 sccm. At operation 408, the space velocity of the oxygen-containing gas is about 0.003 $min^{-1}$ to about 13 $min^{-1}$. Additionally, the film may be UV cured at various thicknesses during operation 408 to further densify the film.

In an exemplary embodiment, a 300 mm circular semiconductor substrate is disposed in a chamber 100 having a process volume of 1.4 L. The silicon-containing gas is $SiH_4$ with a space velocity of about 0.01 $min^{-1}$ and flow rate of about 30 sccm. The first nitrogen-containing gas includes $NH_3$ with a space velocity of about 0.7 $min^{-1}$ and flow rate of about 50 sccm. Ar is flowed into the chamber 100 at a flow rate of about 3000 sccm. $H_2$ at a space velocity of about 0.7 $min^{-1}$ and flow rate of about 1000 sccm is flowed into the chamber 100. The first RF power is applied for about 4 seconds to the silicon and the first-nitrogen containing gas, Ar, and $H_2$ at a frequency of about 13.56 MHz and power level of about 80 W. The first pressure of the chamber 100 is about 2.2 torr. The flow of the second nitrogen-containing includes about 11000 sccm $N_2$ at a space velocity of about 10.7 $min^{-1}$ Ar is flowed into the chamber 100 at a flow rate of about 7600 sccm. The second RF power is applied for about 13 seconds to the nitrogen-containing gas and the Ar at the frequency of about 13.56 MHz and power level of about 100 W. The second pressure of the chamber is about 4 torr. Repeating the cyclic deposition-treatment process for 25 cycles forms a film with a predetermined thickness of about 330 Å. The film of about 330 Å has a stress of about −1.32 GPa, a density of about 2.50 $g/cm^3$, a refractive index of about 2.0002, and a wet etch rate of about 6.5 Å/min. About 16 substrates per hour may be processed via the exemplary embodiment forming the film of about 330 Å. Repeating the cyclic deposition-treatment process for 41 cycles forms a film with a predetermined thickness of about 660 Å. The film of about 660 Å has a stress of about _ GPa, a density of about 2.995 $g/cm^3$, a refractive index of about _, and a wet etch rate of about _ Å/min. About 25 substrates per hour may be processed via the exemplary embodiment forming the film of about 660 Å. In another embodiment using the same substrate configuration and process volume, the substrate is first $NH_3$ soaked by a flow of 400 sccm of $NH_3$ for about 20 seconds. Then, the flow of the first process gas set includes about 50 sccm of $SiH_4$ at a space velocity of about 0.04 $min^{-1}$, about 150 sccm of $NH_3$ at a space velocity of about 0.1 $min^{-1}$, about 2000 sccm of $N_2$ at a space velocity of about 1.4 $min^{-1}$, and about 2000 sccm of Ar at a space velocity of about 1.4 $min^{-1}$. The third RF power is applied for about 15 seconds to the first process gas set at the second frequency of about 300 kHz and first power level of about 75 W. The first pressure of the chamber is about 2 torr to deposit an initiation layer with a thickness of about 20 Å. Transitioning from the depositing the initiation layer includes applying the fourth RF power at the frequency of about 300 kHz and the fourth power level of about 50 W and the third RF power at the frequency of about 13.56 MHz and third power level to the first process gas set for a duration of about 1 second. The flow rate of $NH_3$ is about 150 sccm and the flow rate of $N_2$ is about 2000 sccm during the transitioning from the depositing the initiation layer.

Transitioning to the depositing the bulk silicon nitride layer includes first applying the third RF power at the frequency of about 13.56 MHz and the first power level of about 80 W and the fifth RF power at the frequency of about 300 kHz and the fifth power level of about 30 W to the first process gas set for a duration of about 1 second. The flow rate of $NH_3$ is about 100 sccm and the flow rate of $N_2$ is about 1000 sccm during the transitioning to the depositing of the bulk silicon nitride layer.

The flow of the second process gas set includes about 50 sccm of $SiH_4$ at a space velocity of about 0.04 $min^{-1}$, about 100 sccm of $NH_3$ at a space velocity of about 0.07 $min^{-1}$, and about 3500 sccm of $H_2$ at a space velocity of about 2.5 $min^{-1}$. A bulk silicon nitride layer of about 200 Å is deposited by applying for duration of about 217 seconds the first RF power to the second process gas set at the frequency of about 13.56 MHz and second power level of about 80 W. The second pressure of the chamber is about 2 torr. A film with a predetermined thickness of about 220 Å is formed.

In another embodiment using the same substrate configuration and process volume, the substrate is $NH_3$ soaked by a flow of about 400 sccm of $NH_3$ for about 20 seconds. The flow of the first process gas set includes about 12 sccm of $SiH_4$ at a space velocity of about 0.008 $min^{-1}$, about 1000 sccm of $NH_3$ at a space velocity of about 0.7 $min^{-1}$, and about 1000 sccm of $N_2$ at a space velocity of about 0.009 $min^{-1}$. The first RF power is applied for about 2 seconds to the first process gas set at a frequency of about 13.56 MHz and power level of about 80 W. The first pressure of the process chamber is about 3 torr. The flow of the second process gas set includes about 15000 sccm $N_2$ at a space velocity of about 10.7 $min^{-1}$ and a flow of about 500 sccm $N_2O$ at a space velocity of about 10.7 $min^{-1}$ is additionally flowed. The second RF power is applied for about 10 seconds to the nitrogen-containing gas and the $N_2O$ at the frequency of about 13.56 MHz and power level of 100 W. The second pressure of the chamber is about 4 torr. The layers are UV cured after treatment to further densify the film. The cyclic deposition-treatment process is repeated until a first initiation layer with a predetermined thickness of about 10 Å is formed.

The flow of the fourth process gas set includes about 50 sccm of $SiH_4$ at a space velocity of 0.04 $min^{-1}$, about 150 sccm of $NH_3$ at a space velocity of about 0.11 $min^{-1}$, 2000 sccm of $N_2$ at a space velocity of about 1.4 $min^{-1}$, and about 2000 sccm of Ar at a space velocity of about 1.4 $min^{-1}$. The first RF power is applied for 2 seconds to the fourth process gas set at the frequency of about 300 kHz and first power level of about 80 W. The first pressure of the chamber is about 2 torr to deposit a second initiation layer with thickness of about 10 Å.

Transitioning from the depositing the second initiation layer includes applying the fourth RF power at the first frequency of about 13.56 MHz and the fourth power level of about 50 W and the third RF power at the frequency of about 300 kHz and third power level to the fourth process gas set for a duration of about 1 second. The flow rate of $NH_3$ is about 150 sccm and the flow rate of $N_2$ is about 2000 sccm during the transitioning from the depositing the initiation layer. Transitioning to the depositing the bulk silicon nitride layer includes applying the first RF power at the frequency of about 13.56 MHz and the first power level of about 80 W and a fifth RF power at the frequency of about 300 kHz and the fifth power level of about 30 W to the fourth process gas set for a duration of about 1 second. The flow rate of $NH_3$ is about 100 sccm and the flow rate of $N_2$ is about 1000 sccm during the transitioning to the depositing of the bulk silicon nitride layer.

The flow of the third process gas set includes 50 about sccm of $SiH_4$ at a space velocity of about 0.04 $min^{-1}$, about 100 sccm of $NH_3$ at a space velocity of about 0.07 $min^{-1}$, about 3000 sccm of $H_2$ at a space velocity of 2.1 $min^{-1}$, and about 3000 sccm of Ar at a space velocity of 2.1 $min^{-1}$. A bulk silicon nitride layer of about 200 Å is deposited by applying for duration of about 217 seconds the first RF power to the third process gas set at the frequency of about 13.56 MHz and first power level of about 80 W. The second pressure of the chamber is about 2 torr to deposit the bulk silicon nitride layer. A film with a predetermined thickness of about 220 Å is formed.

In summation, a PECVD process that forms silicon and nitride containing films having substantially equivalent stresses, densities, refractive indices, and wet etch rates of silicon and nitride containing films formed by ALD is disclosed. The PECVD processes enable throughput of at least 16 substrates per hour.

While the foregoing is directed to examples of the present disclosure, other and further examples of the disclosure may be devised without departing from the basic scope thereof, and the scope thereof is determined by the claims that follow.

What is claimed is:

1. A method for forming a silicon nitride film, comprising:
  disposing a substrate including a surface in a chamber;
  flowing a silicon-containing gas and a first nitrogen-containing gas into the chamber at a first total flow rate;
  depositing a silicon and nitrogen containing layer on the surface of the substrate by applying a first radio frequency (RF) power at a first power level to the silicon-containing gas and the first nitrogen-containing gas;
  discontinuing the flow of the silicon-containing gas and the first nitrogen-containing gas and flowing a second nitrogen-containing gas into the chamber, wherein a flow rate of the second nitrogen-containing gas is higher than the first total flow rate;
  treating the silicon and nitrogen containing layer by applying a second RF power to the second nitrogen-containing gas at a second power level higher than the first power level; and
  repeating the flowing the silicon-containing gas and the first nitrogen-containing gas, the depositing the silicon and nitrogen containing layer, the discontinuing the flow of the silicon-containing gas and the first nitrogen-containing gas and the flowing the second nitrogen-containing gas, and the treating the silicon and nitrogen containing layer until a film with a predetermined thickness is formed.

2. The method of claim 1, wherein
  the silicon-containing gas comprises silane ($SiH_4$);
  the silicon-containing gas is flowed at a flow rate of about 10 standard cubic centimeters per minute (sccm) to about 50 sccm;
  the first nitrogen-containing gas comprises at least one of ammonia ($NH_3$) and diatomic nitrogen gas ($N_2$);
  the ammonia of the first nitrogen-containing gas is flowed at a flow rate of about 30 sccm to about 1500 sccm;
  the diatomic nitrogen gas of the first nitrogen-containing gas is flowed at a flow rate of about 500 sccm to about 3000 sccm;

the second nitrogen-containing gas comprises diatomic nitrogen gas ($N_2$); and the second nitrogen-containing gas is flowed at a flow rate about 10000 sccm to about 20000 sccm.

3. The method of claim 1, wherein a pressure of the chamber is not greater than 6 torr, and wherein the pressure in chamber during the treating of the silicon and nitrogen containing layer is higher than the pressure in the chamber during the depositing of the silicon and nitrogen containing layer.

4. The method of claim 1, wherein
the first power level is about 50 Watts (W) to about 100 W;
the first RF power is applied for a duration of about 1 second to about 5 seconds;
the second power level is about 80 W to about 120 W; and
the second RF power is applied for a duration of about 5 seconds to 15 seconds.

5. The method of claim 4, further comprising:
flowing an oxygen-containing gas into the chamber; and
applying the second RF power to the oxygen-containing gas during the treating the silicon and nitrogen containing layer or applying the second RF power to the oxygen-containing gas after the treating the silicon and nitrogen containing layer, wherein the second RF power after the treating the silicon and nitrogen containing layer is applied for a duration of about 2 seconds to about 10 seconds at the second power level.

6. A method for forming a silicon nitride film, comprising:
disposing a substrate including a surface in a chamber;
flowing a first process gas set comprising a silicon-containing gas and a first nitrogen-containing gas into the chamber, wherein the first process gas set is diatomic hydrogen gas-free;
depositing an initiation layer on the surface of the substrate by applying a third radio frequency (RF) power to the first process gas set at a second frequency and a third power level;
discontinuing the flowing the first nitrogen-containing gas of the first process gas set and flowing a second process gas set comprising the silicon-containing gas, a second nitrogen-containing gas, and a hydrogen-containing gas into the chamber, wherein the second process gas set is diatomic nitrogen gas-free; and
depositing a bulk silicon nitride layer on the initiation layer by applying a first RF power to the second process gas set at a first frequency higher than the second frequency and a first power level higher than the third power level.

7. The method of claim 6, wherein
the silicon-containing gas comprises silane ($SiH_4$);
while flowing the first process gas set, the silicon-containing gas is flowed at a flow rate of about 10 standard cubic centimeters per minute (sccm) to about 50 sccm;
the first nitrogen-containing gas comprises ammonia ($NH_3$) and diatomic nitrogen gas ($N_2$);
while flowing the first process gas set, the ammonia is flowed at a flow rate of about 100 sccm to about 200 sccm and the diatomic nitrogen gas ($N_2$) is flowed at a flow rate of about 1000 to about 3000 sccm;
the second nitrogen-containing gas comprises ammonia ($NH_3$);
while flowing the second process gas set, the second nitrogen-containing gas is flowed at a flow rate about 100 sccm to about 200 sccm;
the hydrogen-containing gas comprises diatomic hydrogen gas ($H_2$); and
while flowing the second process gas set, the hydrogen-containing gas is flowed at a flow rate of about 3000 sccm to 4000 sccm.

8. The method of claim 6, wherein a pressure of the chamber is not greater than 8 torr, and wherein the pressure in chamber during the depositing of the initiation layer is the same as the pressure in the chamber during the depositing of the bulk silicon nitride layer.

9. The method of claim 6, wherein
the third power level is about 50 Watts (W) to about 100 W;
the second frequency is less than 500 kilohertz (kHz);
the third RF power is applied for a duration of about 10 seconds to 20 seconds;
the first power level is about 50 W to about 100 W;
the first frequency is about 10 megahertz (MHz) to about 20 MHz; and
the first RF power is applied for a duration of about 200 seconds to 300 seconds.

10. The method of claim 6, further comprising flowing about 200 sccm to about 600 sccm of $NH_3$ prior to the flowing the first process gas set.

11. The method of claim 6, further comprising flowing an oxygen-containing gas into the chamber and applying the third RF power to the oxygen-containing gas, wherein the third RF power is applied to the oxygen-containing gas during the depositing the initiation layer.

12. The method of claim 11, further comprising flowing the oxygen-containing gas into the chamber and applying the first RF power to the oxygen-containing gas, wherein the first RF power is applied to the oxygen-containing gas during the depositing of the bulk silicon nitride layer.

13. The method of claim 6, further comprising:
transitioning from the depositing the initiation layer by applying a fourth RF power at the first frequency and a fourth power level of about 25 W to about 75 W and the third RF power at the first frequency and the third power level to the first process gas set for a duration of about 1 second to about 3 seconds, wherein the third power level is higher than the fourth power level; and
transitioning to the depositing the bulk silicon nitride layer by applying the first RF at the first frequency and the first power level and a fifth RF power at the first frequency and a fifth power level of about 15 W to about 45 W to the first process gas set for a duration of about 1 second to about 3 seconds, wherein a flow rate of the first nitrogen-containing gas during the transitioning from the depositing the initiation layer is higher than a flow rate of the first nitrogen-containing gas at the transitioning to the depositing of the bulk silicon nitride layer.

14. A method for forming a silicon nitride film, comprising:
disposing a substrate including a surface in a chamber;
flowing a first process gas set comprising a silicon-containing gas and a first nitrogen-containing gas into the chamber at a first total flow rate;
depositing a silicon and nitride containing layer on the surface of the substrate by applying a first radio frequency (RF) power to the first process gas set at a first frequency of 10 megahertz (MHz) and 20 MHz and a first power level of about 50 Watts (W) to about 100 W for a duration of about 1 second to about 5 seconds at a first pressure of the chamber less than 8 torr;
discontinuing the flow of the first process gas set;
flowing a second process gas set comprising a second nitrogen-containing gas into the chamber at a second total flow rate, wherein the second total flow rate is higher than the first total flow rate;

treating the silicon and nitrogen containing layer by applying a second RF power at the first frequency and a second power level of about 80 W to about 120 W to the second process gas set for a duration of about 5 second to 15 seconds at a second pressure of the chamber, wherein the second power level is higher than the first power level, and wherein the first pressure of the chamber is higher than the second pressure of the chamber;

repeating the flowing the first process gas set, the depositing the silicon and nitride containing layer, the discontinuing the flow of the first process gas set, the flowing the second process gas set, and the treating of the silicon and nitrogen containing layer until a first initiation layer with a predetermined thickness is formed;

discontinuing the flow of the second process gas set and flowing a third process gas set comprising the silicon-containing gas, a third nitrogen-containing gas, and a hydrogen-containing gas into the chamber, wherein the third process gas set is diatomic nitrogen gas-free; and depositing a bulk silicon nitride layer on the first initiation layer by applying the first RF power to the third process gas set at the first frequency and the first power level for a duration of about 200 to about 300 seconds at a third pressure of the chamber, wherein the second pressure of the chamber is higher than the third pressure of the chamber.

15. The method of claim 14, wherein the silicon-containing gas comprises silane ($SiH_4$);

while flowing the first process gas set, the silicon-containing gas is flowed at a flow rate of about 10 standard cubic centimeters per minute (sccm) to about 50 sccm;

the first nitrogen-containing gas comprises ammonia ($NH_3$) and diatomic nitrogen gas ($N_2$);

while flowing the first process gas set, the ammonia is flowed at a flow rate of about 750 sccm to about 1500 sccm and the diatomic nitrogen gas ($N_2$) is flowed at a flow rate of about 1000 to about 3000 sccm;

the second nitrogen-containing gas comprises diatomic nitrogen gas ($N_2$);

while flowing the second process gas set, the second nitrogen-containing gas is flowed at a flow rate about 10000 sccm to about 20000 sccm;

the third nitrogen-containing gas comprises ammonia ($NH_3$);

while flowing the third process gas set, the second nitrogen-containing gas is flowed at a flow rate about 100 sccm to about 200 sccm;

the hydrogen-containing gas comprises diatomic hydrogen gas ($H_2$); and while flowing the third process gas set, the hydrogen-containing gas is flowed at a flow rate of about 3000 sccm to 4000 sccm.

16. The method of claim 14, further comprising:

flowing a fourth process gas set comprising the silicon-containing gas and the first nitrogen-containing gas into the chamber, wherein the fourth process gas set in diatomic hydrogen gas-free;

depositing a second initiation layer by applying a third RF power to the fourth process gas set at a second frequency less than 500 kilohertz (kHz) and a third power level of about 50 W to about 100 W, wherein the first power level is higher than the third power level and the first frequency is higher than the second frequency;

transitioning from the depositing the second initiation layer by applying a fourth RF power at the first frequency and a fourth power level of about 25 W to about 75 W and the third RF power at the first frequency and the third power level to the fourth process gas set for a duration of about 1 second to about 3 seconds, wherein the third power level is higher than the fourth power level;

transitioning to the depositing the bulk silicon nitride layer by applying the first RF at the first frequency and the first power level and a fifth RF power at the first frequency and a fifth power level of about 15 W to about 45 W to the fourth process gas set for a duration of about 1 second to about 3 seconds, wherein a flow rate of the first nitrogen-containing gas during the transition from the depositing the second initiation layer is higher than a flow rate of the first nitrogen-containing gas at the transitioning to the depositing of the bulk silicon nitride layer; and discontinuing the flow of the fourth process gas set.

17. The method of claim 16, further comprising flowing an oxygen-containing gas into the chamber and applying the third RF power to the oxygen-containing gas, wherein the third RF power is applied to the oxygen-containing gas during the depositing of the second initiation layer.

18. The method of claim 14, further comprising flowing about 200 sccm to about 600 sccm of ammonia ($NH_3$) prior to the flowing the first process gas set.

19. The method of claim 14, further comprising:

flowing an oxygen-containing gas into the chamber; and applying the second RF power to the oxygen-containing gas during the treating the silicon and nitrogen containing layer or applying the second RF power to the oxygen-containing gas after the treating the silicon and nitrogen containing layer, wherein the second RF power is applied for a duration of about 2 seconds to about 10 seconds at the second power level.

20. The method of claim 19, further comprising flowing the oxygen-containing gas into the chamber and applying the first RF power to the oxygen-containing gas, wherein the first RF power is applied to the oxygen-containing gas during the depositing of the bulk silicon nitride layer.

* * * * *